(12) United States Patent
Honjo

(10) Patent No.: US 8,508,048 B2
(45) Date of Patent: Aug. 13, 2013

(54) SEMICONDUCTOR DEVICE UTILIZING A PACKAGE ON PACKAGE STRUCTURE AND MANUFACTURING METHOD THEREOF

(75) Inventor: Hiroshi Honjo, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 13/298,425

(22) Filed: Nov. 17, 2011

(65) Prior Publication Data
US 2012/0139122 A1     Jun. 7, 2012

(30) Foreign Application Priority Data

Dec. 2, 2010 (JP) ................................. 2010-269105

(51) Int. Cl.
*H01L 23/48* (2006.01)
*H01L 21/56* (2006.01)
*H01L 21/58* (2006.01)

(52) U.S. Cl.
USPC .............. 257/773; 257/E23.01; 257/E21.502; 257/686; 257/685; 257/723; 257/724; 257/728; 257/777; 257/784; 257/786

(58) Field of Classification Search
USPC ................. 257/773, 686, 685, 723, 724, 728, 257/777, 784, 786, E23.01, E21.502
See application file for complete search history.

(56) References Cited

U.S. PATENT DOCUMENTS

| 6,157,080 A * | 12/2000 | Tamaki et al. ................. 257/738 |
| 6,320,251 B1 * | 11/2001 | Glenn ............................ 257/678 |
| 8,193,624 B1 * | 6/2012 | Sohn ............................. 257/686 |
| 2008/0157325 A1 * | 7/2008 | Chow et al. ..................... 257/686 |
| 2010/0327420 A1 * | 12/2010 | Xiao et al. ...................... 257/686 |
| 2011/0115098 A1 * | 5/2011 | Song et al. ...................... 257/777 |
| 2011/0241192 A1 * | 10/2011 | Ding et al. ...................... 257/686 |
| 2012/0199963 A9 * | 8/2012 | Do et al. ......................... 257/686 |
| 2012/0286432 A1 * | 11/2012 | Do et al. ......................... 257/777 |

* cited by examiner

*Primary Examiner* — A O Williams
(74) *Attorney, Agent, or Firm* — Sheridan Ross P.C.

(57) ABSTRACT

A semiconductor device which includes a substrate, a semiconductor chip which is mounted on the substrate, a package in which an upper surface of the substrate and the semiconductor chip are sealed using an insulating material, and a molding material which is exposed to the upper surface of the package. In addition, the device includes a lead of which one end is connected to the mold material and the other end is electrically connected to the substrate, which is integrally formed of the same material as from a connection portion with the mold material to a connection portion with the substrate, and of which the connection portion with the mold material is exposed to the upper surface of the package.

4 Claims, 8 Drawing Sheets

SEMICONDUCTOR DEVICE UTILIZING A PACKAGE ON PACKAGE STRUCTURE AND MANUFACTURING METHOD THEREOF

BACKGROUND

The present disclosure relates to a semiconductor device and a manufacturing method thereof, which is formed from a package which includes a semiconductor chip.

In an electronic apparatus, a so-called PoP (Package on Package) structure is proposed (for example, refer to Pamphlet of International Publication No. WO 2006-082620 in FIG. 1) in which a plurality of packages including a semiconductor chip is laminated, in order to realize miniaturization of components which use a semiconductor chip.

In the PoP structure, it has an advantage in which an area for mounting is reduced and a transmission path is short, compared to a structure in which a plurality of packages is aligned horizontally.

In a PoP structure in the related art, connection between a lower package and an upper package is performed using solder balls or a wiring which is provided at the periphery of the semiconductor chip of the lower package.

In this configuration, the upper package is necessary to be formed to a large size to correspond to a connection portion of the solder ball, or the like.

SUMMARY

As described above, in the configuration in which the lower package and the upper package are connected using the solder balls or the wiring which is provided at the periphery of the semiconductor chip of the lower package, it is necessary to design the upper package according to a size of the lower package.

For this reason, it is difficult to standardize the upper package, or to use an arbitrary package such as a general-purpose package as the upper package. In addition, when a new product is used in the lower package, it is necessary to newly develop the upper package according to the lower package, as well.

Specifically, in a configuration in which the connection between the lower package and the upper package is performed using the solder ball, a size of the connection portion is determined by a pitch or a size of the solder ball.

In order to secure a reliable connection in consideration of bending of the package, it is necessary for the solder ball to have the large pitch and size, and, accordingly, the external size of the package increases.

In addition, if a size of the semiconductor chip in the upper package is smaller than that of the lower package, a distance between the semiconductor chip of the upper package and the connection portion with the lower package becomes long. In this case, it may be considered to connect the connection portion with the lower package, to the upper package, using a wiring layer which is formed in a relay board.

For example, the connection may be performed such that a via hole which passes through from a pad of the substrate to an upper surface, is formed in the lower package, a conductive layer is embedded in the via hole, and the conductive layer and the upper package are connected using the wiring layer which is formed in the relay board.

However, when adopting the relay board, it is necessary to form the conductive layer in the via hole and the wiring layer of the relay board in a separate process, respectively, and the number of processes are increased. Accordingly, the manufacturing cost increases and the productivity decreases.

It is desirable to provide a semiconductor device and a manufacturing method thereof in which it is possible to improve the degree of freedom of the configuration of the upper package with a PoP structure, and manufacture the device at a comparatively low cost.

According to an embodiment of the present disclosure, there is provided a semiconductor device which includes a substrate, a semiconductor chip which is mounted on the substrate, a package which is configured by sealing an upper surface of the substrate and the semiconductor chip, using an insulating material, and a molding material which is exposed to the upper surface of the package.

In addition, the device includes a lead of which one end is connected to the mold material and the other end is electrically connected to the substrate, which is integrally formed of the same material as from a connection portion with the mold material to a connection portion with the substrate, and of which the connection portion with the mold material is exposed to the upper surface of the package.

According to the above described embodiment of the disclosure, the device may be configured by the mold material, and the lead of which one end is connected to the mold material and the other end is electrically connected to the substrate, and which is integrally formed of the same material as from a connection portion with the mold material to a connection portion with the substrate.

Accordingly, it is possible to electrically connect from the substrate to the upper surface of the package easily and at a low cost, using a technique of the related art.

In addition, since the connection portion between the lead and the mold material is exposed to the upper surface of the package, it may be possible to manufacture the package with a PoP structure by electrically connecting the other package to the connection portion with the mold material which is exposed to the upper surface of the package.

In addition, it may be possible to separate the connection portion with the other package from immediately above the connection portion with the substrate using the lead. Accordingly, for example, it is possible to connect the other package to the connection portion with the substrate, even if it is small.

According to another embodiment of the disclosure, there is provided a semiconductor device which includes, a substrate; a first semiconductor chip which is mounted on the substrate; a first package which is configured by sealing an upper surface of the substrate and the first semiconductor chip using an insulating material; and a mold material which is exposed to the upper surface of the first package.

In addition, the device includes a lead of which one end is connected to the mold material and the other end is electrically connected to the substrate, which is integrally formed of the same material as from a connection portion with the mold material to a connection portion with the substrate, and of which the connection portion with the mold material is exposed to the upper surface of the first package.

Further, the device includes a second semiconductor chip, and a second package which is configured by sealing the second semiconductor chip, using an insulating material, and which is electrically connected to a connection portion with the mold material of the lead which is exposed to the surface of the first package.

According to the above described embodiment of the disclosure, the device may be configured by the mold material, and the lead of which one end is connected to the mold material and the other end is electrically connected to the substrate, and which is integrally formed of the same material from a connection portion with the mold material to a connection portion with the substrate.

In this manner, it may be possible to electrically connect between the substrate and the upper surface of the first package easily and at a low cost, using a technology in the related art.

In addition, since the connection portion with the mold material of the lead is exposed to the upper surface of the first package, and second package is electrically connected to the connection portion with the mold material, it may be possible to configure a package with the PoP structure.

Further, the connection portion with the second package may be separated from immediately above the connection portion with the substrate, using the lead. Accordingly, for example, it may be possible to connect the second package to the connection portion with the substrate, even if the second package is small.

According to still another embodiment of the disclosure, there is provided a manufacturing method of a semiconductor device which includes, mounting a semiconductor chip on a substrate; and electrically connecting the other end portion of a lead of which one end is connected to a mold material, and which is integrally formed of the same material from a connection portion with the mold material to the other end, to the substrate.

Further, the method includes, forming a package by sealing an upper surface of the substrate, a semiconductor chip, the lead, and the mold material, using an insulating material, so as to expose the connection portion with the mold material of the lead and the mold material, to the upper surface of the package.

According to the above described embodiment of the disclosure, in the manufacturing method of the semiconductor device, the other end of the lead of which one end may be connected to the mold material, and which is integrally formed of the same material, from the connection portion with the mold material to the other end, may be electrically connected to the substrate. In addition, the package is formed by sealing the upper surface of the substrate, the semiconductor chip, the lead, and the mold material, using the insulating material, so as to expose the connection portion with the mold material of the lead and the mold material to the upper surface.

In this manner, it is possible to electrically connect between the substrate and the upper surface of the package, easily and at a low cost.

In addition, since the connection portion with the mold material of the lead can be exposed to the upper surface of the package, it is possible to manufacture the package with the PoP structure, by electrically connecting the other package to the connection portion with the mold material, which is exposed to the upper surface of the package.

Further, it is possible to separate the connection portion with the second package from immediately above the connection portion with the substrate using the lead.

According to the embodiments of the disclosure, it is possible to configure and manufacture the package with the PoP structure at a low cost, since it is possible to electrically connect between the substrate and the upper surface of the package easily and at a low cost.

In addition, according to the embodiments of the disclosure, it is possible to improve the degree of freedom in configuration of the other package (the second package), since it is possible to separate the connection portion with the other package (the second package), from immediately above of the connection portion with the substrate using the lead.

In this manner, for example, it is possible to use a small package, a general-purpose package, or a standardized package as the other package (the second package).

DETAILED DESCRIPTION OF EMBODIMENTS

Hereinafter, the embodiments of the disclosure will be described.

In addition, descriptions will be made in the following order.

1. First embodiment
2. Modified example

1. First Embodiment

Figure 1:
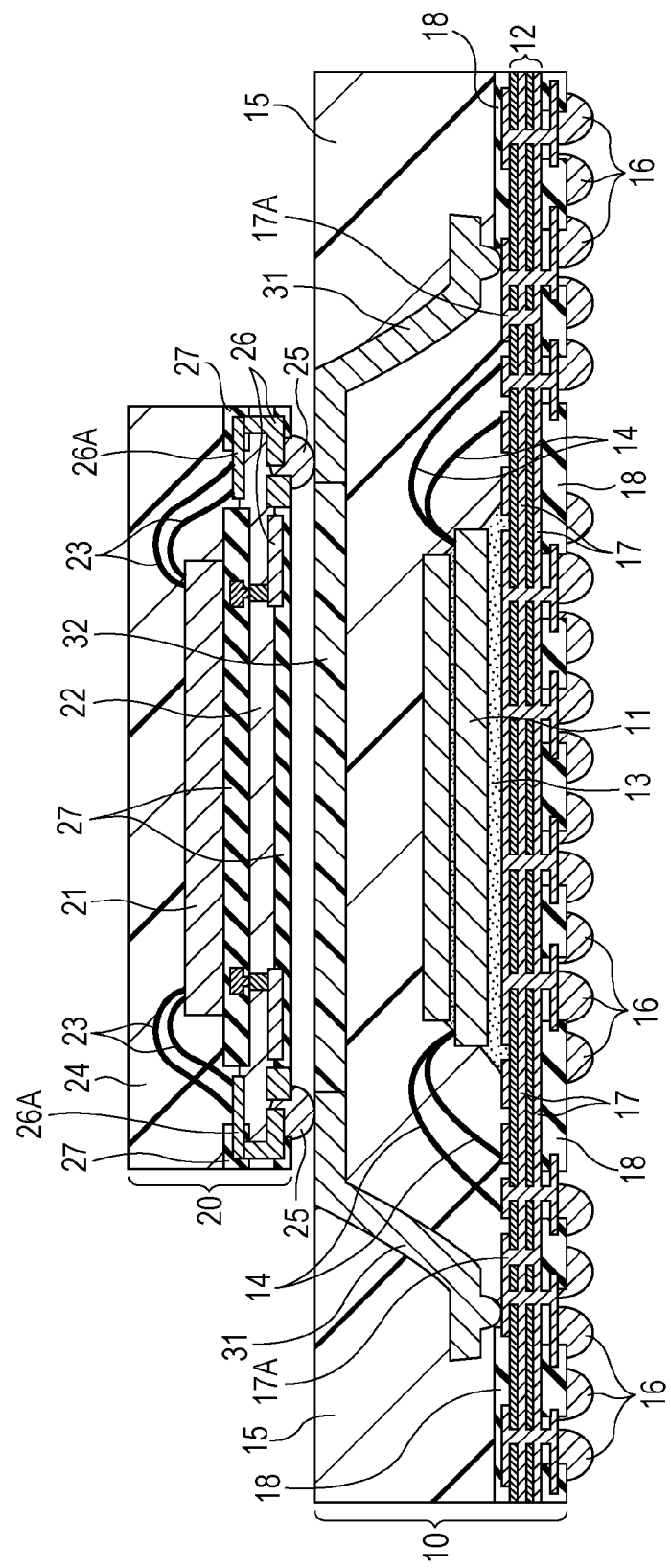
FIG. 1 is a schematic configuration diagram (a cross-sectional diagram which illustrates a partial side surface) of a semiconductor device according to a first embodiment of the present disclosure.

FIG. 1 is a diagram which illustrates a schematic configuration (a cross-sectional diagram which illustrates a partial side surface) of a semiconductor device according to a first embodiment of the disclosure.

The semiconductor device has a PoP structure in which a first package (a lower package) 10 and a second package (an upper package) 20 are laminated.

The first package (the lower package) 10 includes a first semiconductor chip 11 which is sealed using a mold resin 15.

The first semiconductor chip 11 is die-bonded onto an interposer board 12 using insulating, or conductive paste 13.

The interposer board 12 is configured by forming a wiring layer 17 in a core material in the horizontal and vertical directions. Among the wiring layers 17, the wiring layer which is exposed to a surface of the interposer board 12, is a pad 17A. In addition, the first package (the lower package) 10 is configured when an upper surface of the interposer board 12 is completely sealed with the mold resin 15.

An insulating material (solder resist, or the like) 18 is formed on an upper surface and a lower surface of the interposer board 12, so as to cover a part of the wiring layer 17 which is exposed from the interposer board 12.

In addition, a plurality of solder balls 16 which is connected to the wiring layer 17 which is exposed to the lower surface side, is formed, on the lower surface of the interposer board 12.

Further, an electrode pad (not shown in drawings) which is formed on the upper surface of the first semiconductor chip 11, and the wiring layer 17 on the upper surface of the interposer board 12 are electrically connected to each other, using gold wire 14.

The second package (the upper package) 20 is formed to be sealed with a second semiconductor chip 21 or a mold resin 24.

The second semiconductor chip 21 is disposed to the insulating material 27 on the upper surface of the substrate in which the insulating materials 27 are formed on both the upper and lower surfaces of the core material 22. In this substrate, a wiring layer 26 is formed inside of the insulating material 27 or in a portion where the insulating material 27 is not present, in the upper surface or the lower surface thereof. In addition, the wiring layer 26 includes a plug layer which passes through a part of the core material. In the wiring layer 26, the wiring layer which is exposed to the upper surface of the substrate, is the pad 26A. In addition, the upper surface of the substrate is completely sealed with the mold resin 24, thereby forming the second package (the upper package) 20.

In addition, solder balls 25 are formed by being connected to the wiring layer 26 which is exposed to the lower surface of the substrate.

Further, an electrode pad (not shown in drawings) formed on the upper surface of the second semiconductor chip 21 and the pad 26A on the upper surface of the substrate are electrically connected to each other, using a gold wire 23.

In addition, the gold wire 14 in the first package 10 and the solder balls 16, or the gold wire 23 of the second package 20 shown in FIG. 1, are not all present in the same cross section. In FIG. 1, for these components 14, 16, and 23, some components which are present on a different cross section, as seen laterally, are illustrated together.

In the embodiment, specifically, a pad 17A on the upper surface of the interposer board 12 of the first package 10 and solder balls 25 of the second package 20 are electrically connected to each other, using a peripheral package 30 which is provided in the first package 10.

The peripheral package 30 is formed of the mold resin 32 and a lead frame 31 which extends from the mold resin 32.

In addition, in the peripheral package 30, the mold resin 32 and a portion of the lead frame 31 which is in the vicinity of the mold resin 32 (a connection portion) are exposed to the surface of the mold resin 15 of the first package 10. The solder balls 25 of the second package 20 are electrically connected onto the connection portion in the vicinity of the mold resin 32 of the lead frame 31, which is exposed to the surface of the first package.

Further, the lead frame 31 of the peripheral package 30 is formed to be bent to have a gullwing shape. In addition, one end of the lead frame 31 is connected to the mold resin 32 to be fixed, and a front end of the other end of the lead frame 31 is connected to the pad 17A on the upper surface of the interposer board 12 of the first package 10. The lead frame 31 is integrally formed of the same material from one end which is the connection portion with the mold resin 32, to the other end which is the connection portion with the pad 17A.

The peripheral package can be manufactured using a configuration in the related art, and, accordingly, can be manufactured at a low cost.

In a common peripheral package, the semiconductor chip is molded in the mold resin, and the lead frame and the semiconductor chip are electrically connected to each other using a wire, or the like, in the mold resin.

The peripheral package 30 according to the embodiment does not include the semiconductor chip or the wire in the mold resin 32, and, accordingly, the mold resin 32 can be formed thinner by that amount. For this reason, for example, if the mold for the mold resin 32 is changed to a configuration which corresponds to the thin mold resin 32, it is possible to manufacture the peripheral package in a normal peripheral package production line.

The arrangement of the lead frame 31 which extends from the mold resin 32 of the peripheral package 30 is not particularly limited. It may be the LQFP (Low-profile Quad Flat Package) in which the lead frame 31 extends in two directions horizontally, and may be the TSOP (Thin Small Outline Package) in which the lead frame 31 extends in the four front and rear, and right and left directions.

In addition, in FIG. 1, the mold resin 32 of the peripheral package 30 and the lead frame 31 have substantially the same thickness, however, the thickness may be slightly different from each other, and any one may be thicker than the other.

The shape of the lead frame 31 of the peripheral package 30 is not limited to the gullwing shape, and may have the other shapes. In addition, in FIG. 1, the intermediate portion of the lead frame 31 is formed to be extended in an oblique direction, however, the intermediate portion of the lead frame 31 may be formed to be a vertically extended shape, or a shape which is extended in a substantially vertical direction.

Whatever the shape of the lead frame is, it may be integrally formed of the same material from one end which is the connection portion with the mold resin, to the other end which is the connection portion with the substrate.

The configuration of the first semiconductor chip 11 of the first package 10 and the second semiconductor chip 21 of the second package 20 is not particularly limited, and semiconductor chips which have various functions may be used.

Specifically, for example, the first semiconductor chip 11 may be used as a processing circuit, and the second semiconductor chip 21 may be used as a memory circuit.

According to the embodiment of the disclosure, for example, it is possible to manufacture the semiconductor device as described below.

Figure 2:
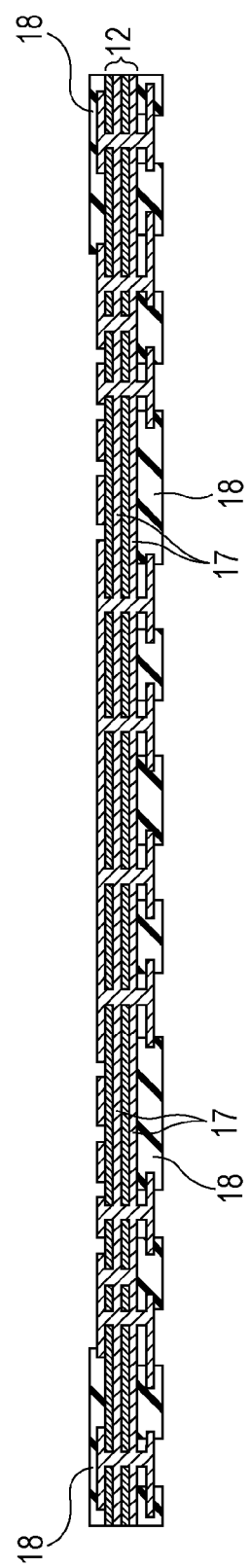
FIG. 2 is a diagram of a manufacturing process which illustrates a manufacturing method of the semiconductor device shown in FIG. 1.

First, as shown in FIG. 2, the interposer board 12 is prepared. The interposer board 12 has a configuration in which the wiring layer 17 is formed horizontally and vertically on the core material. Among the wiring layers 17, the wiring layer 17 on the surface of the interposer board 12 is the pad 17A.

Figure 3:
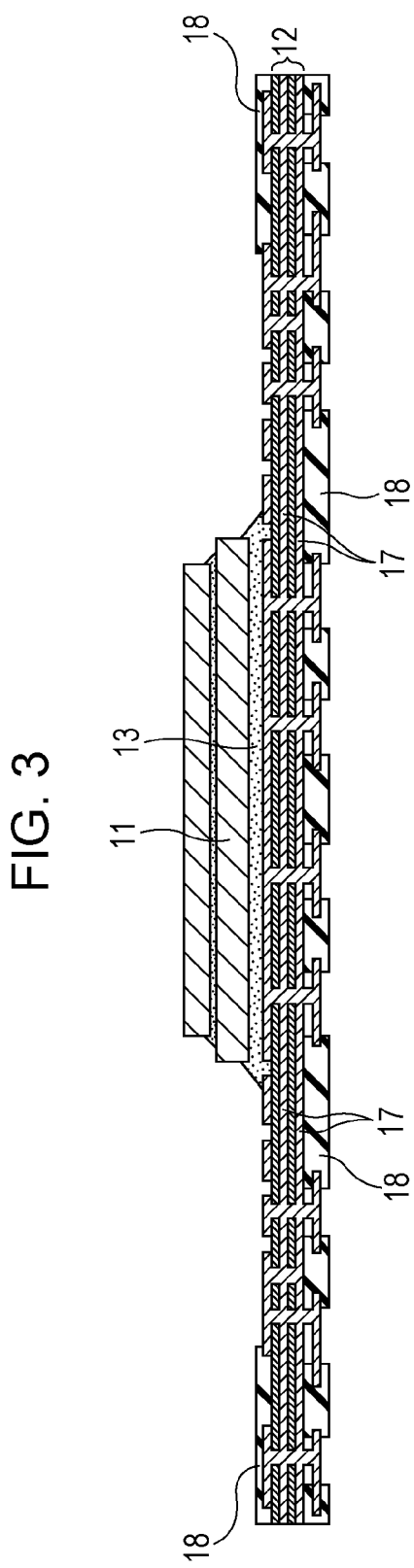
FIG. 3 is a diagram of a manufacturing process which illustrates the manufacturing method of the semiconductor device shown in FIG. 1.

Subsequently, as shown in FIG. 3, as a die-bonding process, the first semiconductor chip 11 is die-bonded onto the interposer board 12 using conductive or insulating paste 13.

Figure 4:
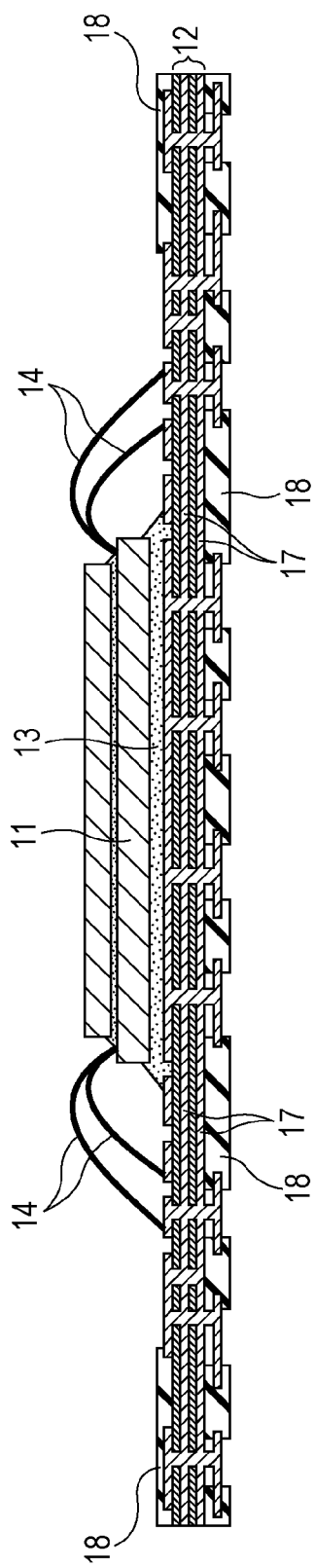
FIG. 4 is a diagram of a manufacturing process which illustrates the manufacturing method of the semiconductor device shown in FIG. 1.

Subsequently, as shown in FIG. 4, as a wire bonding process, the electrode pad (not shown in drawings) on the first semiconductor chip 11 and the inner lead pattern (the wiring layer 17) of tee interposer board 12 are connected to each other using the gold wire 14.

Figure 5:
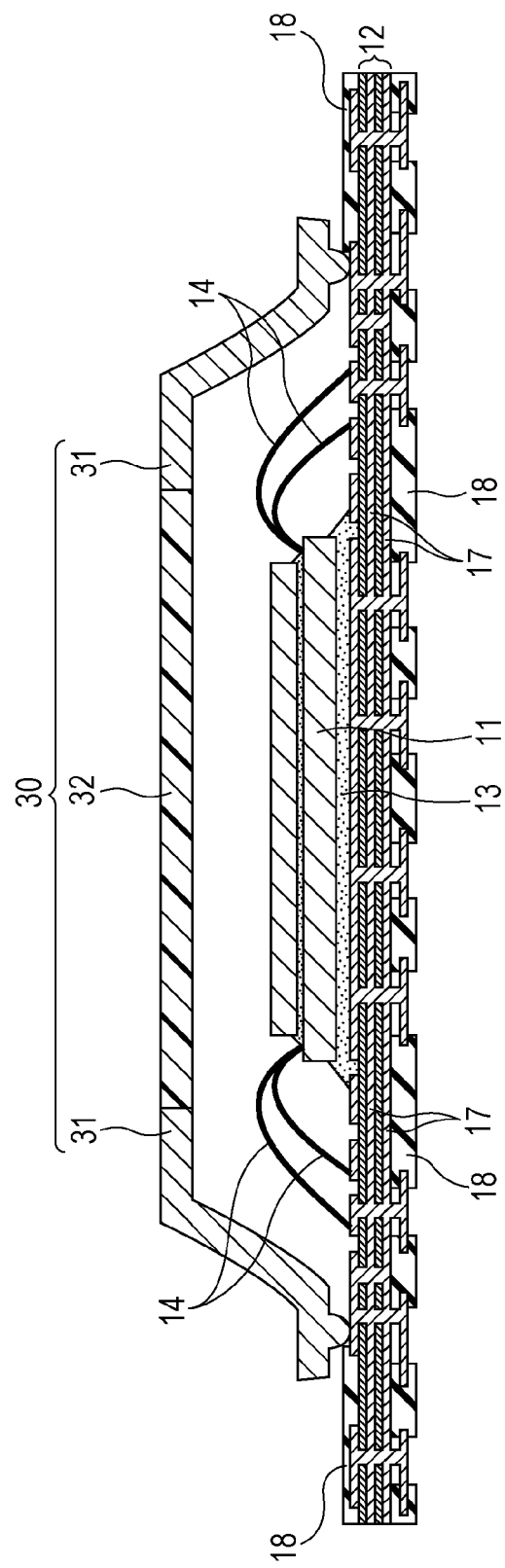
FIG. 5 is a diagram of a manufacturing process which illustrates the manufacturing method of the semiconductor device shown in FIG. 1.

Subsequently, as shown in FIG. 5, the peripheral package 30, which is formed of the lead frame 31 and the mold resin 32, is die-bonded to the pad 17A, which is exposed to the surface of the interposer board 12, using the conductive paste in the front end portion of the lead frame 31.

Figure 6:
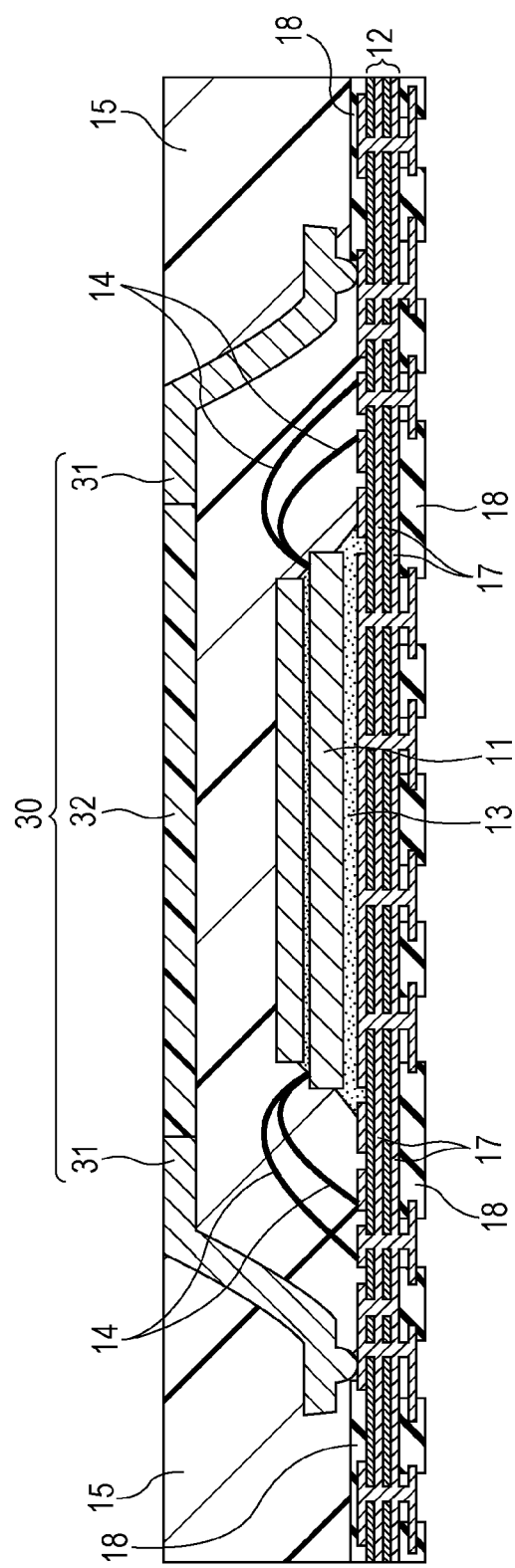
FIG. 6 is a diagram of a manufacturing process which illustrates the manufacturing method of the semiconductor device shown in FIG. 1.

Subsequently, as shown in FIG. 6, as a molding process, the first semiconductor chip 11, the gold wire 14, and the peripheral package 30 (31 and 32) are sealed with the mold resin 15, on only one surface of the interposer board 12, thereby forming the package. At this moment, the lead frame 31 and the mold resin 32 of the peripheral package 30 are exposed to the upper surface of the package, by allowing the upper surface of the peripheral package 30 to come into contact with a wall face of the gold wire.

Figure 7:
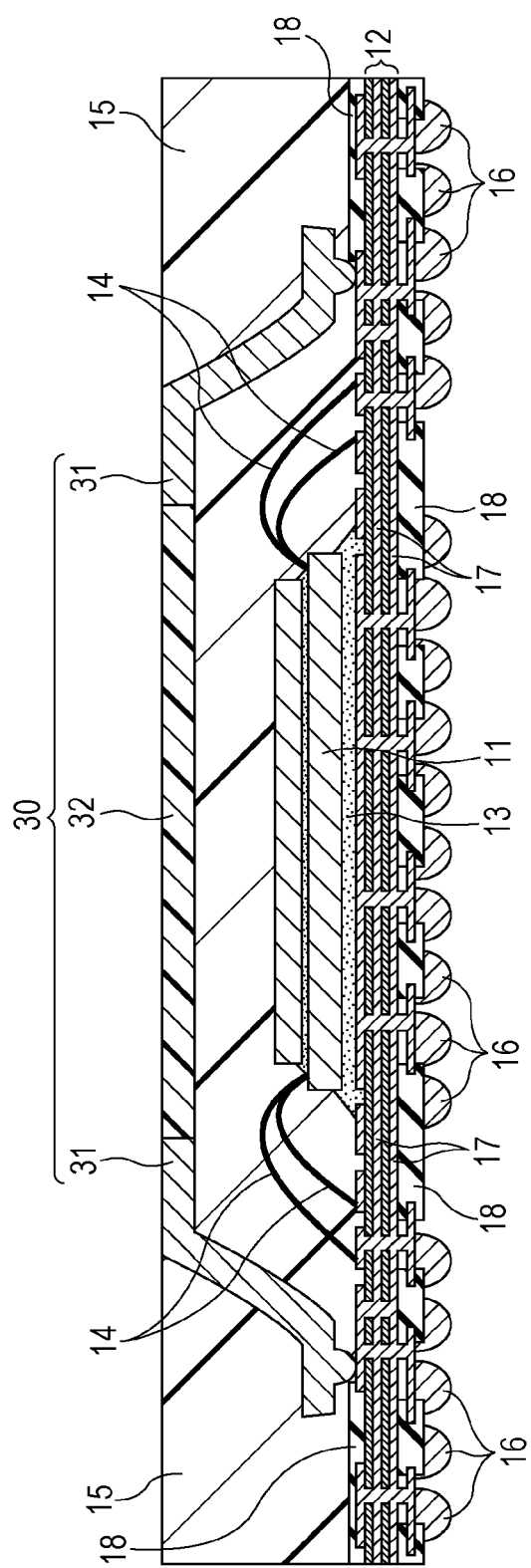
FIG. 7 is a diagram of a manufacturing process which illustrates the manufacturing method of the semiconductor device shown in FIG. 1.

Subsequently, as shown in FIG. 7, as a ball mounting process, the solder balls 16 as an external terminal are mounted on the rear surface of the interposer board 12, and are firmly fixed using a reflow method. In this manner, the first package (the lower package) 10 shown in FIG. 1 is completed.

Figure 8:
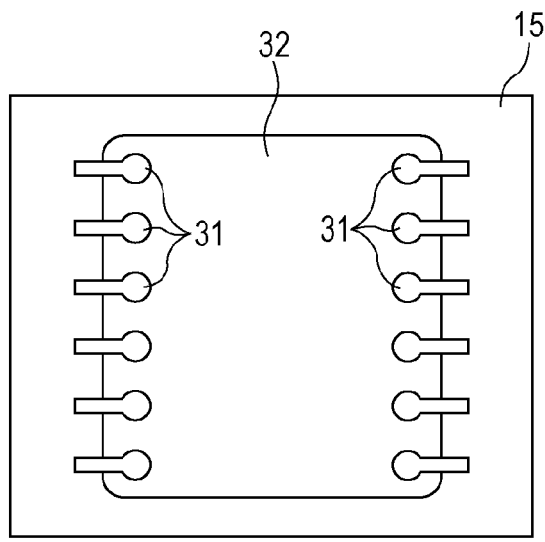
FIG. 8 is a plan view of a package of FIG. 7 where a peripheral package has a TSOP configuration.

Here, a plan view of the package (the first package 10) shown in FIG. 7 where the configuration of the peripheral package 30 (31 and 32) is TSOP, is illustrated in FIG. 8.

As shown in FIG. 8, a substantially circular portion of one end of the lead frame 31 is embedded in a substantially circular hole which is formed at the left and right edges of the mold resin 32 of the peripheral package 30. In the lead frame 31, a portion in the vicinity of the connection portion with the mold resin 32, is exposed to the surface of the mold resin 15 of the first package 10.

Thereafter, solder balls 25 on the lower surface of the second package (the upper package) 20, is connected to the lead frame 31 (particularly to the substantially circular front end portion shown in FIG. 8) of the peripheral package 30, which is exposed to the upper surface of the first package (the lower package) 10.

In this manner, it is possible to manufacture the semiconductor device according to the embodiment shown in FIG. 1.

In addition, it is possible to manufacture the peripheral package 30 as described in below.

Figure 9A:
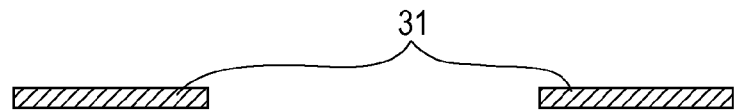
FIG. 9A to 9C are diagrams of manufacturing processes for illustrating manufacturing methods of peripheral packages A to C.

The lead frame 31, which is linearly extended as shown in FIG. 9A, is prepared.

Figure 9B:
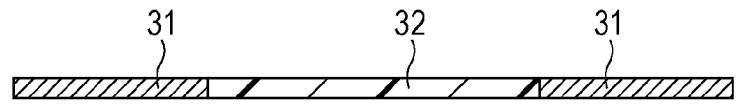

Subsequently, as shown in FIG. 9B, as the molding process, one end portion of the lead frame 31 is sealed with the mold resin 32.

Figure 9C:
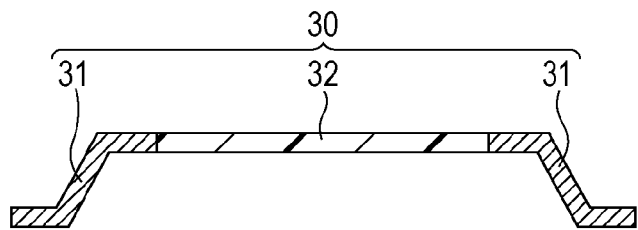

Subsequently, as shown in FIG. 9C, as a lead forming process, an outer lead portion of the lead frame 31, which is the outer side of the mold resin 32, is formed to have a predetermined gullwing shape.

In this manner, it is possible to manufacture the peripheral package 30 which is formed of the lead frame 31 and the mold resin 32.

In the configuration of the semiconductor device according to the above described embodiment, one end of the lead frame 31 is sealed and fixed with the mold resin 32, configuring the peripheral package 30. In addition, the other end of the lead frame 31 is electrically connected to the pad 17A on the upper surface side of the interposer board 12, and the connection portion of the lead frame 31 with the mold resin 32 and the mold resin 32 are exposed to the upper surface of the first package 10. The lead frame 31 is integrally formed of the same material, from one end which is the connection portion with the mold resin 32 to the other end which is the connection portion with the pad 17A.

In this manner, it is possible to manufacture the peripheral package 30 which is formed of the lead frame 31 and the mold resin 32, easily and at a low cost, using a peripheral package manufacturing technology of the related art. In addition, since the lead frame 31 is integrally formed of the same material, from the connection portion with the mold resin 32 to the connection portion with the pad 17A, it is possible to electrically connect between the interposer board 12 and the upper surface of the first package 10, at a low material cost.

Further, the connection portion of the lead frame 31 with the mold resin 32 is exposed to the upper surface of the first package 10, and the solder balls 25 of the second package 20 are electrically connected to the connection portion, whereby the package with the PoP structure is configured.

Therefore, it is possible to configure and manufacture the package with the PoP structure at a low cost, by adopting the configuration according to the embodiments of the disclosure.

In addition, it is possible to separate the connection portion with the second package 20, from immediately above of the connection portion of the interposer board 12 with the pad 17A, using the lead frame 31. In this manner, it is possible to improve the degree of freedom in configuration of the second package 20.

For example, the second package 20 can be connected even if it is smaller than the first package 10.

For example, it is possible to use a general-purpose package or a standardized package as the second package. By using the general-purpose package or the standardized package, it is possible to reduce development costs, and to shorten the development period.

In addition, FIG. 1 shows a state where the first package 10 and the second package 20 are connected to each other, however, for example, it is possible to manufacture and sell a single body of the first package 10, which corresponds to the general-purpose second package 20 or the standardized second package 20, using the configuration according to the embodiment.

2. Modified Example

In the above described embodiment, the connection between the second package 20 and the peripheral package 30 was performed using the solder balls 25 which are formed at the lower surface of the substrate of the second package 20.

In this modified example, the electrical connection between the second package and the upper surface (peripheral package) of the first package is not limited to the solder balls, and it may have another configuration. For example, LGA (Land Grid Array), PGA (Pin Grid Array), an anisotropic conductive layer, and the like, are exemplified.

In the above described embodiment, the first semiconductor chip 11 and the second semiconductor chip 21 were sealed with the mold resin 15 and the mold resin 24, respectively, and the mold resin 32 was connected to one end of the lead frame 31.

In this modified example, the mold material which is connected to the insulating material which seals the semiconductor chip, or one end of the lead, is not limited to the mold resin, and may be an insulating material (ceramics or the like) or a mold material which is formed of the other material. When mold resin is used as the insulating material or a mold material, it is possible to perform sealing easily and at a low cost, compared to the other materials.

In the above described embodiment, the interposer board 12 in which the wiring layers 17 were horizontally and vertically formed on the core material, was used as the substrate of the first package.

In this modified example, a substrate which has another configuration may be used as the substrate for the first package (the lower package).

It may have a configuration in which the semiconductor chip is mounted to the substrate, the lead can be electrically connected to the wiring layer or the pad which is formed on the upper surface of the board, and the electric connection to the outside of the package is possible at the lower surface, or the like.

In the above described embodiment, two packages were laminated to form the package with the PoP structure. However, in this modified example, it is possible to be three or more packages to be laminated.

In this modified example, the connection member which is formed of the lead and the mold material is used to packages from the first package from below to the (n−1)th package, among the laminated n packages (n is a natural number which is 2 or more).

The present disclosure contains subject matter related to that disclosed in Japanese Priority Patent Application JP 2010-269105 filed in the Japan Patent Office on Dec. 2, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
   a substrate;
   a semiconductor chip which is mounted on the substrate;
   a package which is configured by sealing an upper surface of the substrate and the semiconductor chip, using an insulating material;
   a mold material which is exposed to the upper surface of the package;
   a lead of which one end is connected to the mold material and the other end is electrically connected to the substrate, which is integrally formed of the same material as from a connection portion with the mold material to a connection portion with the substrate, and of which the connection portion with the mold material is exposed to the upper surface of the package; and
   a pad which is formed on an upper surface of the substrate, and to which the other end of the lead is directly and electrically connected.

2. A semiconductor device comprising:
   a substrate;
   a first semiconductor chip which is mounted on the substrate;
   a first package which is configured by sealing an upper surface of the substrate and the first semiconductor chip using an insulating material;
   a mold material which is exposed to the upper surface of the first package;
   a lead of which one end is connected to the mold material and the other end is electrically connected to the substrate, which is integrally formed of the same material as from a connection portion with the mold material to a connection portion with the substrate, and of which the connection portion with the mold material is exposed to the upper surface of the first package;
   a pad which is formed on the upper surface of the substrate, and to which the other end of the lead is directly and electrically connected;
   a second semiconductor chip; and
   a second package which is configured by sealing the second semiconductor chip, using an insulating material, and which is electrically connected to a connection portion with the mold material of the lead which is exposed to the surface of the first package.

3. The semiconductor device according to claim 2, further comprising:
   solder balls which are formed on the lower surface of the second package, and are electrically connected onto the connection portion with the mold material of the lead which is exposed to the upper surface of the first package.

4. A semiconductor device manufacturing method comprising:
   mounting a semiconductor chip onto a substrate;
   directly and electrically connecting the other end portion of a lead of which one end is connected to a mold material, and is integrally formed of the same material, from a connection portion with the mold material to the other end, to a pad formed on and electrically connected to the upper surface of the substrate; and
   forming a package by sealing an upper surface of the substrate, a semiconductor chip, the lead, and the mold material, using an insulating material, so as to expose the connection portion with the mold material of the lead and the mold material, to the upper surface of the package.

* * * * *